United States Patent
Higuchi et al.

(10) Patent No.: US 6,779,878 B2
(45) Date of Patent: Aug. 24, 2004

(54) PIEZOELECTRONIC ACTUATOR AND LIQUID JETTING HEAD

(75) Inventors: Takamitsu Higuchi, Nagano (JP); Setsuya Iwashita, Nagano (JP); Koji Sumi, Nagano (JP); Masami Murai, Nagano (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/314,418

(22) Filed: Dec. 9, 2002

(65) Prior Publication Data

US 2003/0222948 A1 Dec. 4, 2003

(30) Foreign Application Priority Data

Dec. 10, 2001 (JP) .......................... 2001-375695
Nov. 18, 2002 (JP) .......................... 2002-334241

(51) Int. Cl.[7] ............................ B41J 2/045; H01L 41/04
(52) U.S. Cl. .............................. 347/70; 310/328
(58) Field of Search ........................ 347/68, 70, 71; 310/328, 311, 357

(56) References Cited

U.S. PATENT DOCUMENTS

| 5,650,362 A | * | 7/1997 | Nashimoto ............... 427/126.3 |
| 5,656,382 A | * | 8/1997 | Nashimoto ............... 428/620 |
| 2003/0092203 A1 | * | 5/2003 | Murai ...................... 438/3 |
| 2003/0117041 A1 | * | 6/2003 | Kurihara et al. ............ 310/328 |

* cited by examiner

Primary Examiner—Judy Nguyen
(74) Attorney, Agent, or Firm—Sterne, Kessler, Goldstein & Fox P.L.L.C.

(57) ABSTRACT

The present invention provides an optimum layer structure for a piezoelectric actuator in which (100) orientation strontium ruthenate is used as a bottom electrode. The piezoelectric actuator comprises a Si substrate 20, a diaphragm 30 comprising (110) or (100) orientation strontium oxide which is formed thereon by way of epitaxial growth, a bottom electrode 42 comprising (100) orientation strontium ruthenate having a perovskite structure, a piezoelectric layer 43 comprising (100) orientation PZT, and a top electrode 44.

18 Claims, 5 Drawing Sheets

1: INK-JET RECORDING HEAD

PIEZOELECTRONIC ACTUATOR AND LIQUID JETTING HEAD

BACKGROUND OF THE INVENTION

1. Field of the Invention

The present invention relates to a piezoelectric actuator comprising a piezoelectric body and a pair of electrodes disposed on either side thereof, and particularly relates to a piezoelectric actuator comprising strontium ruthenate as a bottom electrode.

2. Description of the Related Art

A piezoelectric actuator comprises a piezoelectric element in which a piezoelectric film having an electromechanical transducing function is interposed between two electrodes, the piezoelectric film being constituted by crystallized piezoelectric ceramics. Compound oxides having a perovskite crystalline structure and which can be expressed by the chemical formula $ABO_3$ are known as these piezoelectric ceramics. For example, lead zirconate titanate (PZT) in which lead (Pb) is applied to A and zirconium (Zr) and titanium (Ti) are applied to B is known.

Conventionally, Pt has been used as the electrode material of a PZT-based piezoelectric element. Because Pt has a face-centered cubic lattice structure (FCC) which is a closest packing structure, Pt has strong self-orientation. Therefore, when Pt is deposited on an amorphous material such as $SiO_2$, it becomes strongly oriented in the (111) direction, whereby the orientation property of the piezoelectric film thereon also improves. A problem with such a strong orientation property, however, is that columnar crystal grains grow and that Pb or the like tends to diffuse into the lower layer along the grain boundary. Problems also occur in the adhesiveness of the Pt and $SiO_2$.

Further, when Ti is used in order to improve the adhesiveness of the Pt and $SiO_2$, or TiN or the like is used as a diffusion barrier layer for Pb or the like, the electrode structure becomes complicated. Also, as a result, oxidization of the Ti, diffusion of the Ti into the Pt, and defective crystallization of the PZT occur, and thus the electrical characteristics such as the piezoelectric characteristics deteriorate.

Since such problems exist in Pt electrodes, research is being conducted in the fields of ferroelectric memory and the like into the use of conductive oxides such as $RuO_x$, $IrO_2$ and so on as electrode materials. Among these materials, strontium ruthenate has the same perovskite crystalline structure as PZT and therefore has an excellent bonding property at the interface, eases the epitaxial growth of PZT, and also has an excellent characteristic as a Pb diffusion barrier layer.

However, when strontium ruthenate is used as the bottom electrode of a piezoelectric element, the substance constituting the layer therebelow must have physical properties as a diaphragm and chemical properties to appropriately control the orientation of the strontium ruthenate and secure adhesiveness with the substrate and bottom electrode.

SUMMARY OF THE INVENTION

An object of the present invention is to provide a piezoelectric actuator which comprises an optimum layer structure for a case in which (100) orientation strontium ruthenate is used as a bottom electrode. It is a further object to provide a liquid jetting head comprising this piezoelectric actuator.

A piezoelectric actuator according to the present invention comprises a diaphragm comprising (110) or (100) orientation strontium oxide that is formed by means of epitaxial growth on a Si substrate, a bottom electrode comprising (110) orientation strontium ruthenate having a perovskite structure that is formed on the diaphragm; a piezoelectric layer comprising (100) orientation PZT that is formed on the bottom electrode, and a top electrode formed on the piezoelectric layer.

In this piezoelectric actuator, it is desirable that the bottom electrode comprises $SrRuO_3$ layer adjacent to the piezoelectric layer. In this manner, the conductivity as the bottom electrode and the orientation control of the piezoelectric film can be sufficiently secured.

In this piezoelectric actuator, it is desirable for the Si substrate to be oriented in the (100) or (110) direction. In so doing, the strontium oxide can be orientation controlled more favorably.

A liquid jetting head of the present invention comprises the aforementioned piezoelectric actuator, and comprises in the aforementioned Si substrate pressure chambers which are constituted so as to be capable of volumetric change caused by vibration of the diaphragm provided in the piezoelectric actuator.

A liquid jetting device of the present invention comprises the aforementioned liquid jetting head as printing means.

DESCRIPTION OF THE PREFERRED EMBODIMENTS (Overall Constitution of Ink Jet Printer)

Figure 1:
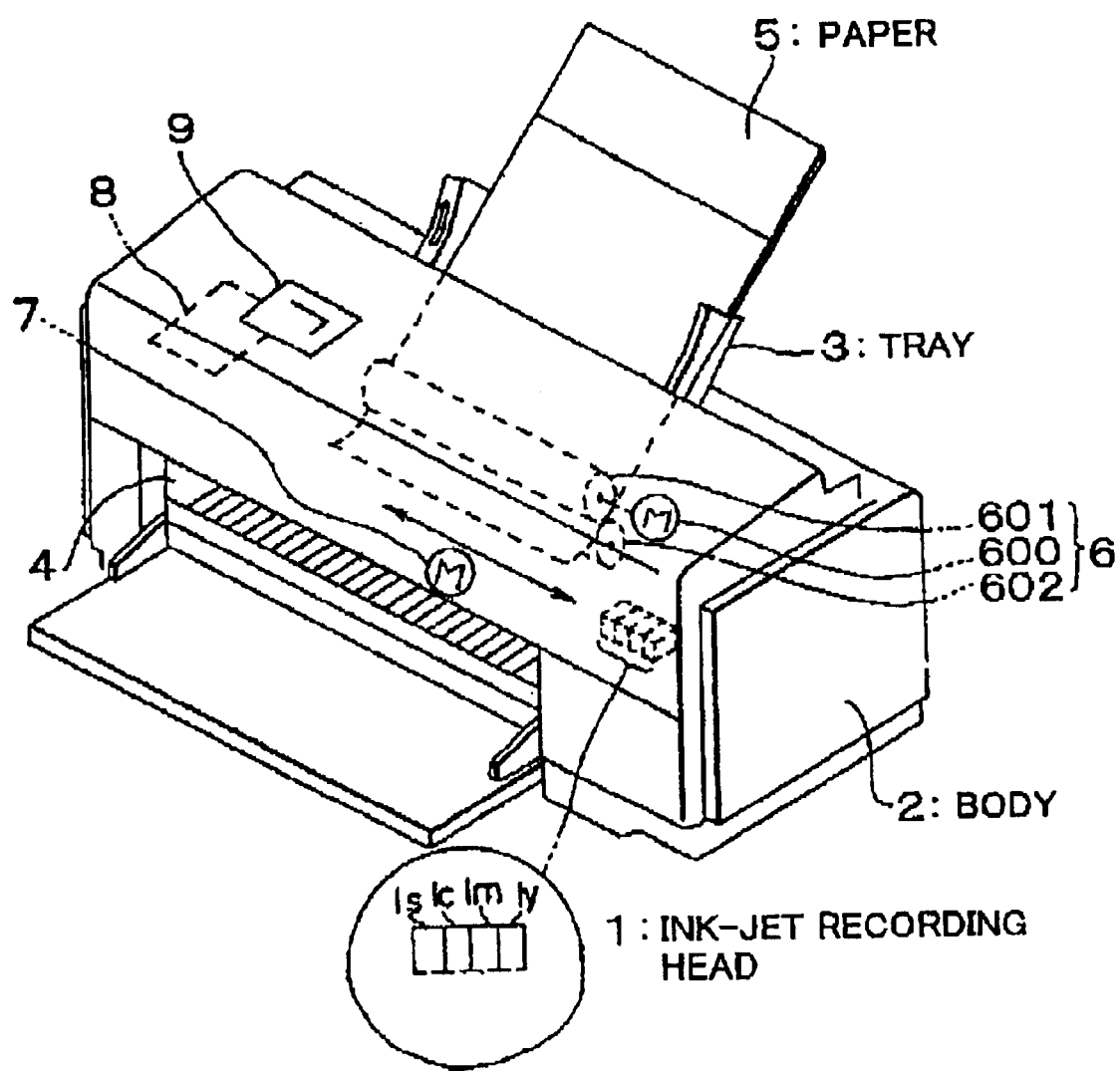
FIG. 1 is a constitutional diagram of an ink jet printer comprising a piezoelectric actuator according to an embodiment of the present invention.

FIG. 1 is a constitutional diagram of an ink jet printer which is one example of a liquid jetting device comprising the piezoelectric actuator according to an embodiment of the present invention. The ink jet printer mainly comprises an ink jet recording head 1, a body 2, a tray 3, and a head driving mechanism 7.

The ink jet recording head 1 is one example of the liquid jetting head of the present invention. The ink jet printer comprises a total of four color ink cartridges, yellow, magenta, cyan, and black, and is constituted so as to be capable of full color printing. This ink jet printer also comprises in its interior a special controller board or the like, by means of which the ink discharge timing of the ink jet recording head 1 and the scanning of the head driving mechanism 7 are controlled.

The body 2 is provided with a tray 3 on its back surface, and an auto sheet feeder (automatic continuous paper supply mechanism) 6 is provided in the interior thereof for automatically feeding paper 5 and discharging this paper 5 from a discharge port 4 on the front surface.

(Overall Constitution of Ink Jet Recording Head)

Figure 2:
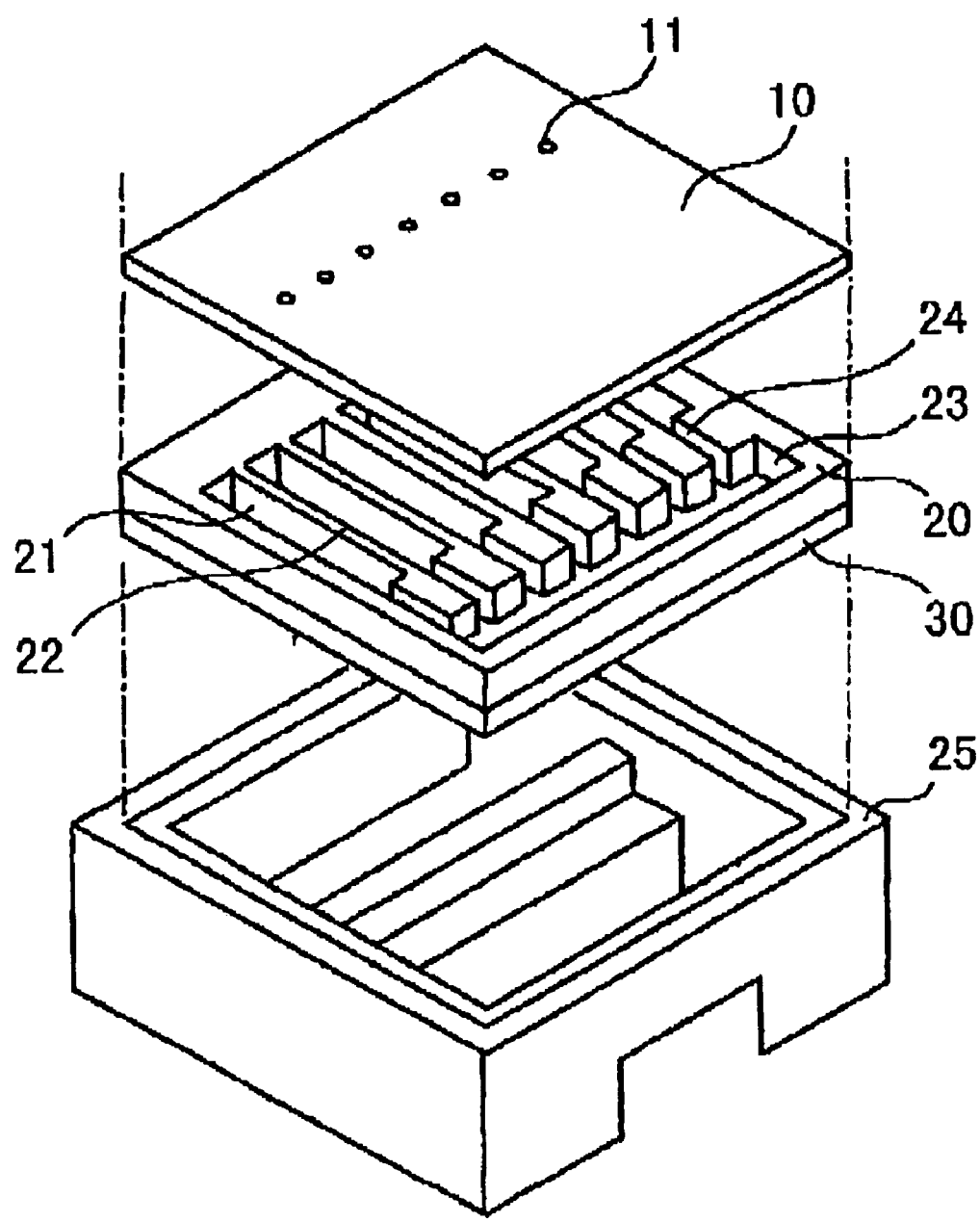
FIG. 2 is an exploded perspective view of an example of an ink jet recording head of the present invention.

In FIG. 2, an exploded perspective view of the aforementioned ink jet recording head is shown. The ink jet recording head 1 comprises a pressure chamber substrate (Si substrate) 20, a diaphragm 30 which is fixed onto one surface thereof, and a nozzle plate 10 which is fixed onto the other surface thereof. This head 1 is constituted by an on-demand type piezo jet head.

The pressure chamber substrate 20 comprises pressure chambers (cavities) 21, side walls (partitions) 22, a reservoir 23, and supply ports 24. The pressure chambers 21 are storage spaces for discharging liquid such as ink. The side walls 22 are formed so as to partition the plurality of pressure chambers 21. The reservoir 23 is a common channel for filling each of the pressure chambers 21 with ink. The supply ports 24 are formed to be capable of leading ink into the pressure chambers 21 from the reservoir 23.

The nozzle plate 10 is bonded to the pressure chamber substrate 20 such that nozzles 11 formed therein are disposed in positions which correspond to each of the pressure chambers 21 provided in the pressure chamber substrate 20. The pressure chamber substrate 20 bonded with the nozzle plate 10 is housed inside a cabinet 25.

A piezoelectric actuator (to be described below) is provided on the diaphragm 30. An ink tank port (not shown) is provided in the diaphragm 30 such that the ink which is stored in the ink tank (not shown) can be supplied to the reservoir 23.

(Layer Structure)

Figure 3:
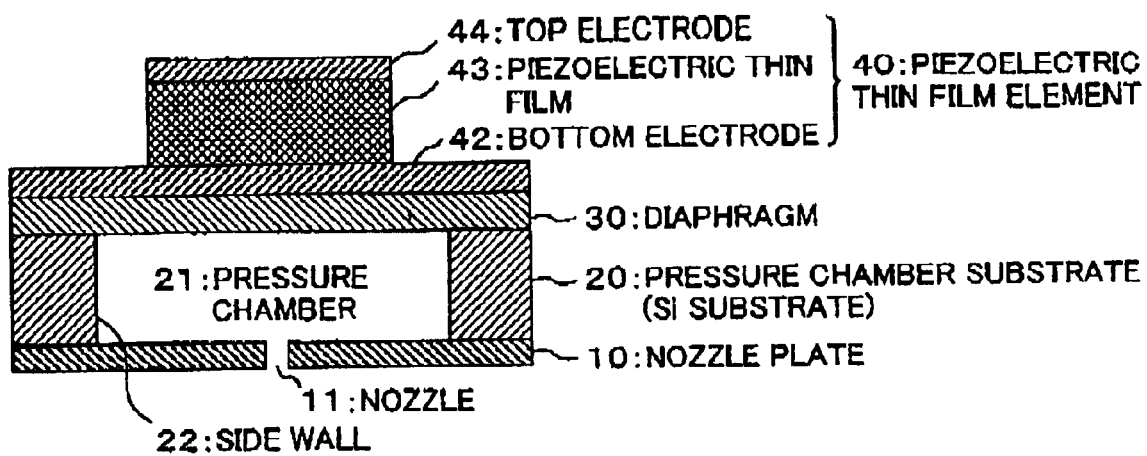
FIG. 3 is a sectional view illustrating the layer structure of the ink jet recording head and the piezoelectric actuator manufactured according to a manufacturing method of the present invention.

FIG. 3 is a sectional view illustrating a layer structure of the ink jet recording head and the piezoelectric actuator manufactured according to a manufacturing method of the present invention. As is illustrated in the figure, the piezoelectric actuator is constituted by the lamination of a Si substrate 20 which is oriented along the (100) or (110) crystallographic direction, a diaphragm 30, a bottom electrode 42, a piezoelectric thin film 43, and a top electrode 44 in this order.

The diaphragm 30 is deformed by deformation of the piezoelectric layer and functions to momentarily raise pressure inside the pressure chambers 21. The diaphragm 30 is constituted by (110) or (100) orientation, preferably (110) orientation strontium oxide (SrO). SrO is suitable for causing epitaxial growth of the bottom electrode 42 which has a (100) orientation perovskite structure. In particular, by epitaxially forming SrO, the SrO crystal lattice on the Si substrate is arrayed in an orderly fashion, and thus SrO can be applied particularly suitably to the formation of the bottom electrode 42.

The bottom electrode 42 is one of the electrodes for applying a voltage to the piezoelectric thin film layer 43, and is formed in the same region as the diaphragm 30 in order to function as a common electrode for a plurality of piezoelectric thin film elements formed on the pressure chamber substrate 20. Note, however, that the bottom electrode 42 may also be formed with the same magnitude as the piezoelectric thin film layer 43, or in other words in the same shape as the top electrode. The bottom electrode 42 is constituted by a conductive metal oxide, particularly (100) orientation strontium ruthenate (SRO). A structure in which an iridium or platinum layer is interposed between two SRO layers may be employed.

The SRO is of a perovskite structure, and is expressed by $Sr_{n+1}Ru_nO_{3n+1}$ (where n is an integer of one or more). When n=1, this becomes $Sr_2RuO_4$. When n=2, this becomes $Sr_3Ru_2O_7$. And when n=∞, this becomes $SrRuO_3$. When SRO is used as the bottom electrode in this embodiment, $SrRuO_3$ is most preferable so that conductivity of the bottom electrode and crystallinity of the piezoelectric thin film can be enhanced. If an iridium or platinum layer is interposed between two SRO layers, it is particularly preferable that the SRO layer adjacent to the piezoelectric thin film layer is $SrRuO_3$.

The piezoelectric thin film layer 43 is a piezoelectric ceramics having a perovskite crystalline structure, and is formed in a predetermined shape on top of the bottom electrode 42. As for the composition of the piezoelectric thin film layer 43, lead zirconate titanate ($Pb(Zr, Ti)O_3$: PZT) or PZT with an additive such as magnesium, zinc or niobium added is particularly preferable. The composition is not limited thereto, however, and lead lanthanum titanate (($Pb, La)TiO_3$), lead lanthanum zirconate (($Pb, La)ZrO_3$), and so on may also be used. The PZT is preferably of a rhombohedral crystal structure and oriented in the (100) direction.

The top electrode 44 is the other electrode for applying a voltage to the piezoelectric thin film layer 43, and is constituted by a conductive material such as platinum (Pt), iridium (Ir), or aluminum (Al), for example. If aluminum is used, iridium or the like is laminated thereon to prevent electric corrosion.

(Operations of the Ink Jet Recording Head)

The operations of the aforementioned ink jet recording head 1 will now be described. When no discharge signal is supplied and a voltage is not applied between the bottom electrode 42 and the top electrode 44 of the piezoelectric thin film element 40, no deformation occurs in the piezoelectric thin film layer 43. When no discharge signal is supplied to the piezoelectric thin film element 40, no pressure change is produced in the pressure chamber 21 corresponding to the piezoelectric thin film element 40, and thus no ink droplets are discharged from the nozzle 11 thereof.

However, when a predetermined discharge signal is supplied and a predetermined voltage is applied between the bottom electrode 42 and the top electrode 44 of the piezoelectric thin film element 40, deformation occurs in the piezoelectric thin film layer 43. When a discharge signal is supplied to the piezoelectric thin film element 40, the diaphragm 30 corresponding to the piezoelectric thin film element 40 greatly yields. As a result, the pressure inside the pressure chamber 21 rises momentarily, and ink droplets are discharged from the nozzle 11. By supplying individual discharge signals to piezoelectric elements in positions on the slender head where printing is desired, desired characters and figures can be printed.

(Manufacturing Method)

A manufacturing process for the piezoelectric actuator of this embodiment will be described with reference to FIG. 4 and in conjunction with a description of a manufacturing process of the ink jet recording head.

Substrate (S1)

Figure 4:
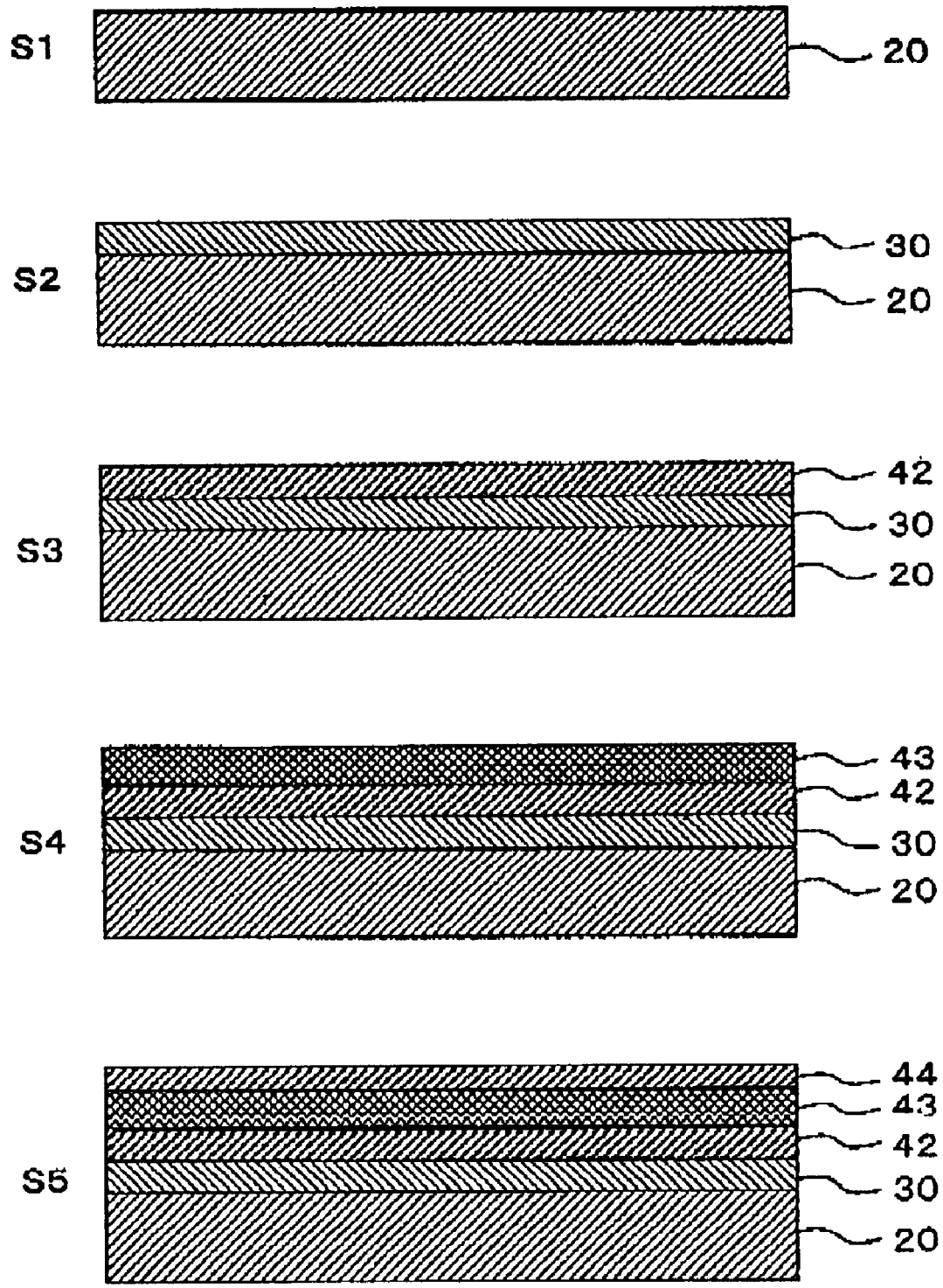
FIG. 4 is a sectional view of the manufacturing process of the piezoelectric actuator.

The piezoelectric actuator of this embodiment is constituted by the depositing of the diaphragm 30, bottom electrode 42, piezoelectric thin film 43, and top electrode 44 onto the pressure chamber substrate 20 shown in FIG. 4 (S1). A single-crystal silicon substrate oriented in the (100) or (110) direction and with a diameter of 100 mm and a thickness of 200 $\mu$m, for example, is used as the pressure chamber substrate 20.

Prior to the formation of the diaphragm, the Si substrate 20 is immersed in an organic solvent, whereupon degreasing and cleaning is performed using an ultrasonic cleaner. Here, a mixed liquid of 1:1 ethyl alcohol and acetone, for example, may be used as the organic solvent, but the organic solvent is not limited thereto. Further, there is no need to perform a process for removing natural oxide film such as RCA cleaning or hydrofluoric cleaning, which is typical cleaning method for a normal Si substrate, and thus the surface of the Si substrate 20 is covered with a natural oxide film.

Formation of Diaphragm (S2)

As is shown in FIG. 4 (S2), the diaphragm 30 constituted by SrO is formed on top of the Si substrate 20 by means of epitaxial growth.

The SrO is set at a thickness of 2 μm or less, for example 0.1 μm.

The degreased and cleaned Si (100) substrate 20 is loaded into a substrate holder, whereupon the substrate holder is introduced into a vacuum device with a back pressure of $1 \times 10^{-8}$ Torr at room temperature and is heated using an infrared lamp so as to rise in temperature by 10° C./min to 700° C. Where the temperature rises over 500° C., the natural oxide film partially vaporizes as SiO, as a result of which pressure rises to $1 \times 10^{-6}$ Torr or greater. At 700° C., however, the pressure reaches a constant value of $5 \times 10^{-7}$ Torr or less. No diffraction pattern is observed in the RHEED pattern from the <011> direction of the Si and hence this is understood to be a Si substrate covered with the natural oxide film. Also, as long as no new thermal oxide film is formed on the Si substrate surface, conditions such as the rate of temperature increase, substrate temperature, and pressure are not limited to those described above.

When the pressure has stabilized, ArF excimer laser (wavelength 193 nm) pulsed light under conditions of energy density of 2.4 J/cm², frequency of 1 Hz, and pulse length of 10 ns is irradiated onto the surface of an $SrO_2$ target disposed facing the Si (100) substrate 20, thereby generating Sr and O plasma plumes on the target surface. These plasma plumes are irradiated onto the Si (100) substrate 20, which is positioned at a distance of 30 mm from the target, for 600 seconds under conditions of substrate temperature of 700° C. and pressure of $5 \times 10^{-7}$ Torr during deposition such that the diaphragm 30 constituted by SrO is deposited at a thickness of 0.1 μm. It can be seen from the RHEED pattern from the <011> direction of the Si that epitaxial growth with the orientation relationships SrO(110)/Si(100) or SrO<001>//Si<011> takes place. The desirable conditions are as follows: the target composition is $SrO_2$; the laser energy density is 2.4 J/cm² or greater; the laser frequency is 1 Hz or less; the distance between the target and the substrate is 30 mm or less; the substrate temperature is no less than 650° C. and no greater than 750° C.; and the pressure during deposition is $5 \times 10^{-7}$ Torr or less. However, as long as Sr plasma can selectively reach the substrate and epitaxial growth as SrO is possible while removing the natural oxide film on the substrate, the conditions are not limited to those described above. Further, similar results can be obtained when a Si (110) substrate is used instead of the Si (100) substrate, and when MgO, CaO, or BaO is used as a buffer layer instead of SrO.

Instead of the laser ablation method, molecular beam epitaxy (MBE), MOCVD, sputtering and so on may be used as epitaxial growth methods for the diaphragm 30. Further, when depositing an SrO film, silicon and boron are preferably doped thereon.

Formation of the Bottom Electrode (S3) As is illustrated in FIG. 4 (S3), the bottom electrode 42 is deposited on top of the diaphragm 30. As the bottom electrode 42, the aforementioned SRO, or a laminated structure of SRO/Pt/SRo or SRO/Ir/SRO is deposited at a thickness of approximately 500 nm. A laser ablation method, for example, may be used as the SRO film deposition method. A well-known thin film manufacturing method such as sputtering is used as the Pt, Ir film deposition method.

First, as for SRO film deposition, an SrO diaphragm 30 is deposited, whereupon ArF excimer laser pulsed light under conditions of energy density of 2.4 J/cm², frequency of 10 Hz, and pulse length of 10 ns is irradiated onto the surface of an $SrRuO_3$ target disposed facing the substrate, thereby generating Sr, Ru, and O plasma plumes on the target surface. These plasma plumes are irradiated onto the Si substrate 20, which is positioned at a distance of 40 mm from the target, for 150 minutes under conditions of substrate temperature of 550° C. and oxygen partial pressure of $1 \times 10^{-2}$ Torr during deposition such that an $SrRuO_3$ bottom electrode 42 is deposited at a thickness of 500 nm. A clear diffraction pattern appears in the RHEED pattern from the <011>direction of the Si so that it becomes clear that the orientation relationships $SrRuO_3(100)/SrO(110)/Si(100)$ or $SrRuO_3<010>//SrO<001>//Si<011>$ are present in a pseudocubic crystalline structure. The desirable conditions are as follows: the target composition is $SrO_2$; the laser energy density is 2.4 J/cm² or greater; the laser frequency is 1 Hz or less; the distance between the target and the substrate is 30 mm or less; the substrate temperature is no less than 550° C. and no greater than 600° C.; partial oxygen pressure during deposition is $1 \times 10^{-3}$ Torr or greater under oxygen gas supply and $1 \times 10^5$ Torr or greater under atomic oxygen radical supply. However, as long as Sr and Ru plasma can reach the substrate at a constant ratio of 1:1, and epitaxial growth as $SrRuO_3$ is possible, the conditions are not limited to those described above. Although the diaphragm 30 consisting of SrO is not deteriorated, a thermal oxide film may be formed at the interface of the Si (100) substrate 20 with the diaphragm 30 by supplying oxygen thereto under a certain conditions By using $CaRuO_3$, $BaRuO_3$ or other perovskite-structure conductive oxides or using the solid solutions thereof as oxide electrodes instead of $SrRuO_3$, similar effects can be obtained. Further, the film manufacturing method is not limited to a laser ablation method, and well-known methods such as MOCVD, sputtering and so on may be used.

Formation of the Piezoelectric Thin Film (S4)

As is illustrated in FIG. 4 (S4), the piezoelectric thin film 43 is deposited on top of the bottom electrode 42. In this embodiment, a PZT film comprising a $Pb(Zr_{0.56}Ti_{0.44})O_3$ composition is deposited using a sol-gel process, for example. More specifically, an organometallic compound such as metal alkoxide is subjected to hydrolysis and polycondensation in a solution system to thereby form a piezoelectric precursor film which is an amorphous film. This is then crystallized by baking.

The PZT undergoes crystal growth under the influence of the crystalline structure of the SRO bottom electrode. In this embodiment, PZT is deposited on the (100) orientation SRO, and as a result a (100) orientation PZT thin film is formed. The thickness of the piezoelectric thin film layer is set at no less than 1 μm and no more than 2 μm, for example.

Formation of the Top Electrode (S5)

As is illustrated in FIG. 4 (S5), the top electrode 44 is formed on top of the piezoelectric thin film 43. More specifically, platinum (Pt) or the like is deposited as the top electrode 44 at a film thickness of 100 nm by means of DC sputtering.

(Formation of the Piezoelectric Actuator)

Figure 5:
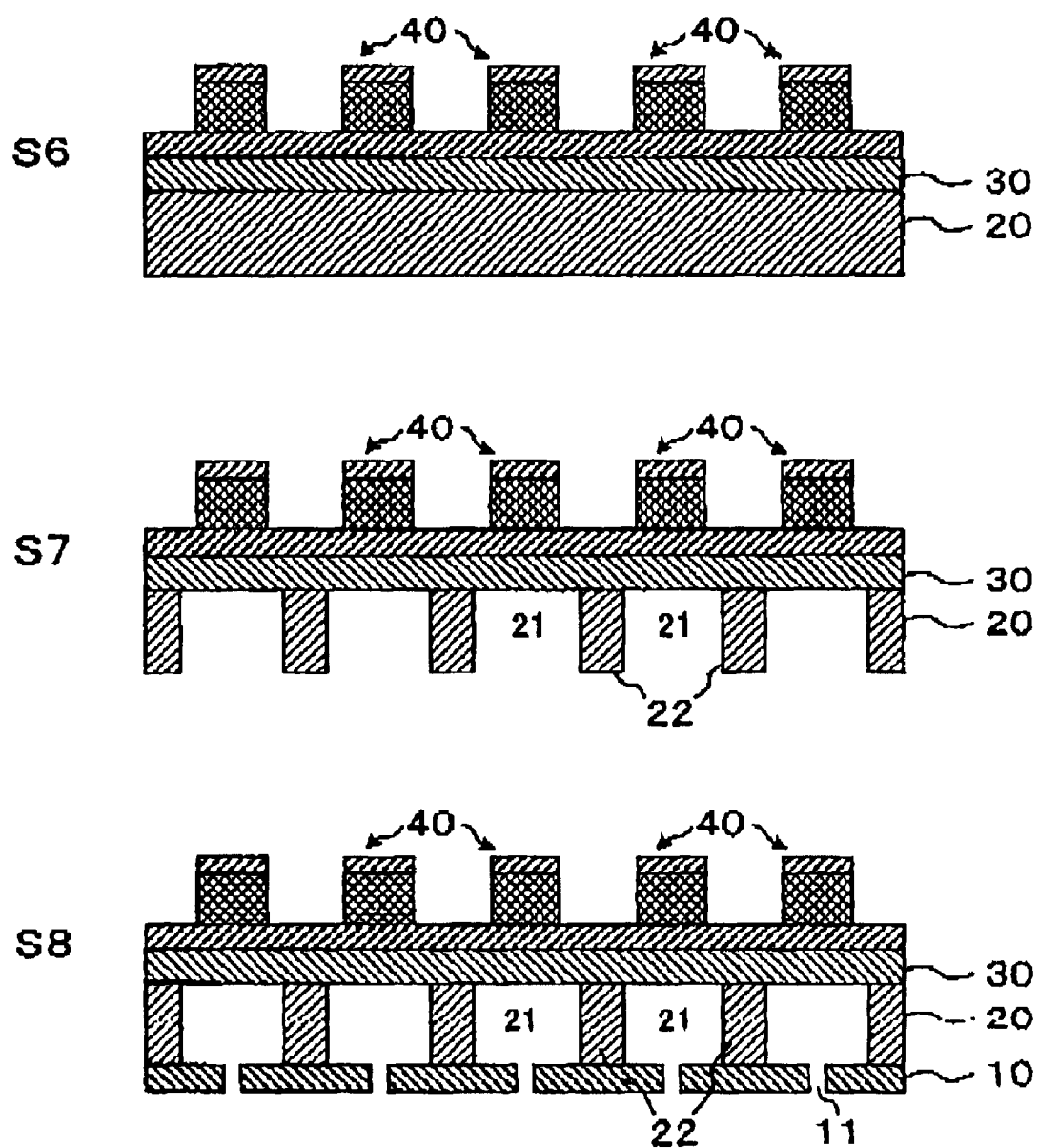
FIG. 5 is a sectional view of the manufacturing process of the ink jet recording head.

As is illustrated in FIG. 5 (S6), the piezoelectric thin film 43 and the top electrode 44 are processed into a predetermined shape to form a piezoelectric actuator. More specifically, resist is spin-coated onto the top electrode 44, whereupon the resist is patterned by exposure and development thereof in alignment with the positions at which the pressure chambers are to be formed. With the remaining resist as a mask, the top electrode 44 and the piezoelectric thin film 43 are etched by ion milling or the like. By means of these processes, a piezoelectric actuator comprising piezoelectric thin film elements 40 is formed.

(Formation of the Ink Jet Recording Head)

As is illustrated in FIG. 5 (S7), pressure chambers 21 are formed in the pressure chamber substrate 20. When a Si (100) substrate is used as the pressure chamber substrate 20, dry etching is used as the formation method of the pressure chambers 21, and when a Si (110) substrate is used, anisotropic etching is used. The remaining parts that are not etched become the side walls 22.

Finally, as is illustrated in FIG. 5 (S8), the nozzle plate 10 is bonded to the pressure chamber substrate 20 using resin or the like. When the nozzle plate 10 is to be bonded to the pressure chamber substrate 20, the position of the nozzle plate 10 is aligned such that the nozzles 11 are disposed corresponding to each of the spaces in the pressure chambers 21. By means of these processes, the ink jet recording head is formed.

The liquid jetting head of the present invention may be applied not only to a head for discharging ink used in an ink jet recording device, but also to various liquid jetting heads such as a head for discharging liquid including color materials used in the manufacture of color filters for liquid crystal displays and the like, a head for discharging liquid including electrode materials used in electrode manufacture for organic EL displays, FED (field emission display), and the like, or a head for discharging liquid including organisms and organic material used in bio-chip manufacture.

According to the present invention, a piezoelectric actuator with an optimum laminated structure can be provided for a case in which (100) orientation strontium ruthenate is used as a bottom electrode. A liquid jetting head comprising this piezoelectric actuator can also be provided.

What is claimed is:

1. A piezoelectric actuator comprising:
   a diaphragm comprising (110) or (100) orientation strontium oxide that is epitaxially formed on a Si substrate;
   a bottom electrode comprising (100) orientation strontium ruthenate having a perovskite structure that is formed on said diaphragm;
   a piezoelectric layer comprising (100) orientation PZT that is formed on said bottom electrode; and
   a top electrode formed on said piezoelectric layer.

2. The piezoelectric actuator according to claim 1, wherein said bottom electrode comprises $SrRuO_3$ layer adjacent to said piezoelectric layer.

3. The piezoelectric actuator according to claim 2, wherein said Si substrate is oriented in the (100) direction.

4. The piezoelectric actuator according to claim 2, wherein said Si substrate is oriented in the (110) direction.

5. The piezoelectric actuator according to claim 1, wherein said Si substrate is oriented in the (100) direction.

6. The piezoelectric actuator according to claim 1, wherein said Si substrate is oriented in the (110) direction.

7. A liquid jetting head comprising:
   a piezoelectric actuator comprising a diaphragm comprising (110) or (100) orientation strontium oxide that is epitaxially formed on a Si substrate, a bottom electrode comprising (100) orientation strontium ruthenate having a perovskite structure that is formed on said diaphragm, a piezoelectric layer comprising (100) orientation PZT that is formed on said bottom electrode, and a top electrode formed on said piezoelectric layer; and
   pressure chambers in said Si substrate which are constituted so as to be capable of volumetric change caused by vibration of said diaphragm.

8. A liquid jetting head according to claim 7, wherein said Si substrate is oriented in the (100) direction.

9. A liquid jetting head according to claim 7, wherein said Si substrate is oriented in the (110) direction.

10. A liquid jetting head according to claim 7, wherein said bottom electrode comprises $SrRuO_3$ layer adjacent to said piezoelectric layer.

11. A liquid jetting head according to claim 10, wherein said Si substrate is oriented in the (100) direction.

12. A liquid jetting head according to claim 10, wherein said Si substrate is oriented in the (110) direction.

13. A printing mechanism comprising:
    a liquid jetting head comprising
       a piezoelectric actuator comprising a diaphragm comprising (110) or (100) orientation strontium oxide that is epitaxially formed on a Si substrate, a bottom electrode comprising (100) orientation strontium ruthenate having a perovskite structure that is formed on said diaphragm, a piezoelectric layer comprising (100) orientation PZT that is formed on said bottom electrode, and a top electrode formed on said piezoelectric layer, and
    pressure chambers in said Si substrate which are constituted so as to be capable of volumetric change caused by vibration of said diaphragm.

14. The printing mechanism according to claim 13, wherein said Si substrate is oriented in the (100) direction.

15. The printing mechanism according to claim 13, wherein said Si substrate is oriented in the (110) direction.

16. The printing mechanism according to claim 13, wherein said bottom electrode comprises $SrRuO_3$ layer adjacent to said piezoelectric layer.

17. The printing mechanism according to claim 16, wherein said Si substrate is oriented in the (100) direction.

18. The printing mechanism according to claim 16, wherein said Si substrate is oriented in the (110) direction.

* * * * *